US007046488B1

(12) United States Patent
Hogg

(10) Patent No.: US 7,046,488 B1
(45) Date of Patent: May 16, 2006

(54) DISK DRIVE COMPRISING DEPLETION MODE MOSFET FOR PROTECTING A HEAD FROM ELECTROSTATIC DISCHARGE

(75) Inventor: Dennis W. Hogg, Laguna Hills, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 0 days.

(21) Appl. No.: 11/031,647

(22) Filed: Jan. 7, 2005

Related U.S. Application Data

(62) Division of application No. 10/329,197, filed on Dec. 24, 2002.

(51) Int. Cl.
G11B 5/40 (2006.01)
H02H 9/00 (2006.01)
H01L 23/62 (2006.01)

(52) U.S. Cl. .................. 360/323; 361/56; 257/355
(58) Field of Classification Search ............... 360/323; 326/72; 361/56; 257/355
See application file for complete search history.

(56) References Cited

U.S. PATENT DOCUMENTS

| 4,800,303 | A | 1/1989 | Graham et al. |
| 5,543,650 | A | 8/1996 | Au et al. |
| 5,587,857 | A | 12/1996 | Voldman et al. |
| 5,644,454 | A | 7/1997 | Arya et al. |
| 5,654,574 | A * | 8/1997 | Williams et al. ............ 257/355 |
| 5,677,205 | A | 10/1997 | Williams et al. |
| 5,712,747 | A | 1/1998 | Voldman et al. |
| 5,757,590 | A | 5/1998 | Phipps et al. |
| 5,771,571 | A | 6/1998 | Voldman et al. |
| 5,811,857 | A | 9/1998 | Assaderaghi et al. |
| 5,877,534 | A * | 3/1999 | Williams et al. ............ 257/355 |
| 5,969,523 | A | 10/1999 | Chung et al. |
| 5,991,134 | A | 11/1999 | Tan et al. |
| 6,233,127 | B1 | 5/2001 | Shimazawa |
| 6,259,573 | B1 | 7/2001 | Tsuwako et al. |
| 6,377,411 | B1 | 4/2002 | Katsumata et al. |
| 6,400,534 | B1 | 6/2002 | Klaassen |
| 6,424,505 | B1 | 7/2002 | Lam et al. |
| 6,504,424 | B1 | 1/2003 | Heminger et al. |
| 6,552,879 | B1 | 4/2003 | Voldman |
| 6,574,078 | B1 | 6/2003 | Voldman |
| 6,710,983 | B1 | 3/2004 | Voldman |
| 6,813,122 | B1 | 11/2004 | Granstrom |
| 6,891,702 | B1 | 5/2005 | Tang |
| 2001/0024348 | A1* | 9/2001 | May et al. ..................... 361/56 |
| 2004/0021997 | A1* | 2/2004 | Choo .......................... 361/56 |

FOREIGN PATENT DOCUMENTS

JP A 10255235 9/1998
WO WO 99/13510 3/1999

* cited by examiner

*Primary Examiner*—Brian E. Miller
(74) *Attorney, Agent, or Firm*—Howard H. Sheerin, Esq.; Jason T. Evans, Esq.

(57) ABSTRACT

A disk drive is disclosed comprising a disk and a head actuated over the disk. The head comprising a first head terminal and a second head terminal. The disk drive further comprises an electrostatic discharge (ESD) protection circuit comprising a first depletion mode metal oxide semiconductor field effect transistor (MOSFET) comprising a gate terminal and a first and second transistor terminals. The first transistor terminal of the first depletion mode MOSFET is coupled to the first head terminal, and the second transistor terminal of the first depletion mode MOSFET is coupled to the second head terminal. The gate terminal is biased to turn on the first depletion mode MOSFET while the disk drive is powered down, thereby shorting the first and second head terminals to protect the head from ESD.

38 Claims, 7 Drawing Sheets

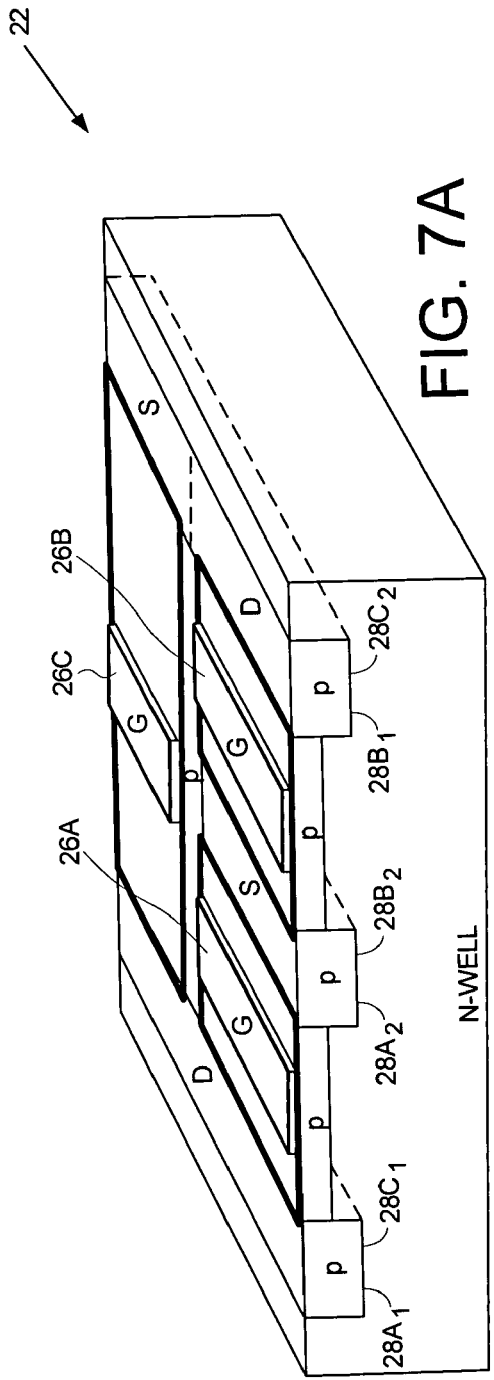
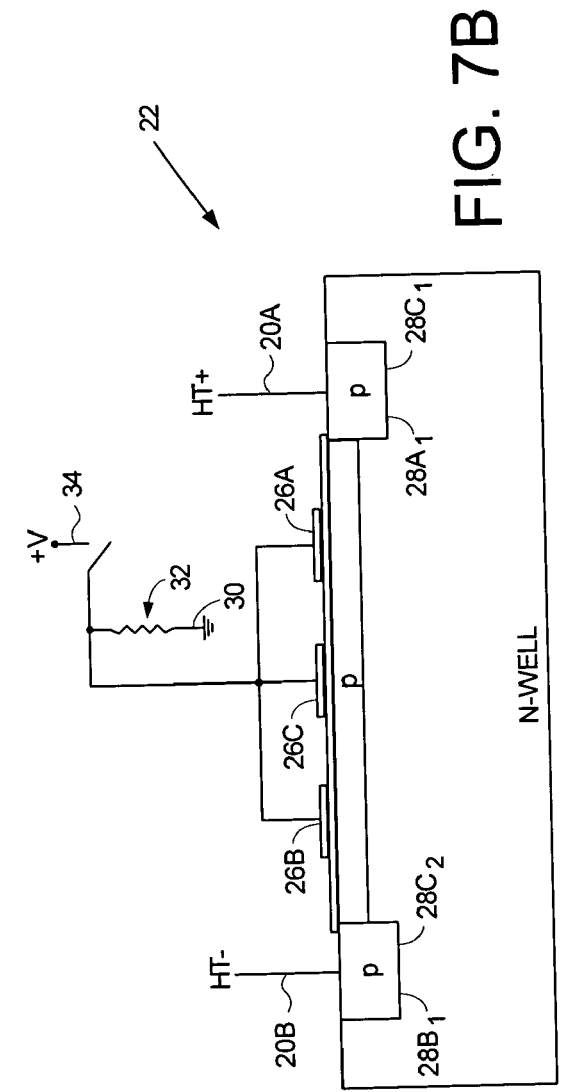
FIG. 7A
FIG. 7B

DISK DRIVE COMPRISING DEPLETION MODE MOSFET FOR PROTECTING A HEAD FROM ELECTROSTATIC DISCHARGE

This application is a divisional of U.S. patent application Ser. No. 10/329,197 filed on Dec. 24, 2002, the disclosure of which is incorporated herein by reference.

BACKGROUND OF THE INVENTION

1. Field of the Invention

The present invention relates to disk drives. More particularly, the present invention relates to a disk drive comprising a depletion mode metal oxide semiconductor field effect transistor (MOSFET) for protecting a head from electrostatic discharge (ESD).

2. Description of the Prior Art

FIG. 1 shows a prior art disk drive comprising a disk 2, an actuator arm 4 rotated about a pivot, and a head 6 attached to a distal end of the actuator arm 4. The disk 2 and head 6 (together with other electronics, such as a preamp circuit not shown) form a channel. The head 6 comprises a first head terminal 8A and a second head terminal 8B extending from a read element. Electrostatic discharge (ESD) can damage the head 6 while inactive, such as during manufacturing, while the disk drive is powered down, or while the head 6 is not being used to read the surface of the disk 2 during normal operation of the disk drive. Magnetoresistive (MR) heads which employ a highly sensitive MR read element are particularly susceptible to ESD, and presumably highly sensitive future head technology will be susceptible to ESD. The prior art disk drive of FIG. 1 employs an ESD protection circuit 10 comprising an array of six diodes for protecting the head 6 while inactive. A first pair of diodes 12A limit the voltage across the head terminals 8A and 8B, a second pair of diodes 12B provide a conductive path for the first head terminal 8A to ground 14, and a third pair of diodes 12C provide a conductive path for the second head terminal 8B to ground 14.

The diodes 12A–12C of the prior art ESD protection circuit 10 provide limited protection since they have a turn on voltage of 0.7 v which may be too high for certain heads. That is, an ESD voltage of less than 0.7 v may damage the head 6 before the diodes 12A–12C turn on. In addition, coupling six diodes 12A–12C to the head terminals 8A and 8B increases the capacitance which decreases the bandwidth (data rate) of the channel.

There is, therefore, a need for a disk drive with improved low voltage ESD head protection as well as reduced channel capacitance to enable faster data rates.

SUMMARY OF THE INVENTION

The present invention may be regarded as a disk drive comprising a disk and a head actuated over the disk, wherein the head comprising a first head terminal and a second head terminal. The disk drive further comprises an electrostatic discharge (ESD) protection circuit comprising a first depletion mode metal oxide semiconductor field effect transistor (MOSFET) comprising a gate terminal and a first and second transistor terminals. The first transistor terminal of the first depletion mode MOSFET is coupled to the first head terminal, and the second transistor terminal of the first depletion mode MOSFET is coupled to the second head terminal. The gate terminal is biased to turn on the first depletion mode MOSFET while the disk drive is powered down, thereby shorting the first and second head terminals to protect the head from ESD.

In one embodiment, the head comprises a magnetoresistive (MR) read element.

In another embodiment, the gate terminal is biased to turn off the first depletion mode MOSFET while the disk drive is powered on. In another embodiment, the gate terminal is biased to turn off the first depletion mode MOSFET while the head is activated for a read operation.

In yet another embodiment, the ESD protection circuit further comprises a second depletion mode MOSFET and a third depletion mode MOSFET each comprising a gate terminal and a first and second transistor terminals. The first transistor terminal of the second depletion mode MOSFET is coupled to the first head terminal, the second transistor terminal of the second depletion mode MOSFET is coupled to ground, the first transistor terminal of the third depletion mode MOSFET is coupled to the second head terminal, the second transistor terminal of the third depletion mode MOSFET is coupled to ground, and the gate terminals are biased to turn on the second and third depletion mode MOSFETs while the disk drive is powered down, thereby grounding the first and second head terminals to protect the head from ESD.

In one embodiment, the ESD protection circuit comprises a complimentary metal oxide semiconductor (CMOS) process. In another embodiment, the ESD protection circuit comprises a bipolar/complimentary metal oxide semiconductor (BiCMOS) process. In yet another embodiment, the ESD protection circuit comprises a silicon germanium (SiGe) process. In still another embodiment, the ESD protection circuit comprises a gallium arsenide (GaAs) process.

In one embodiment, the disk drive further comprising a preamp circuit for amplifying a read signal generated by the head, wherein the ESD protection circuit is integrated into the preamp circuit.

In yet another embodiment, the disk drive further comprises an actuator arm for actuating the head over the disk, wherein the ESD protection circuit comprises an integrated circuit coupled to the actuator arm.

In another embodiment, the head comprises a silicon integrated circuit, and the ESD protection circuit is integrated into the silicon integrated circuit.

The present invention may also be regarded as an electrostatic discharge (ESD) protection circuit for protecting a head actuated over a disk in a disk drive, the head comprising a first head terminal and a second head terminal. The ESD protection circuit comprising a first depletion mode metal oxide semiconductor field effect transistor (MOSFET) comprising a gate terminal and a first and second transistor terminals. The first transistor terminal of the first depletion mode MOSFET is coupled to the first head terminal, and the second transistor terminal of the first depletion mode MOSFET is coupled to the second head terminal. The gate terminal is biased to turn on the first depletion mode MOSFET while the disk drive is powered down, thereby shorting the first and second head terminals to protect the head from ESD.

The present invention may also be regarded as a head for use in a disk drive comprising a disk, the head comprising a first head terminal and a second head terminal. The head comprising a silicon integrated circuit including an electrostatic discharge (ESD) protection circuit comprising a first depletion mode metal oxide semiconductor field effect transistor (MOSFET) comprising a gate terminal and a first and second transistor terminals. The first transistor terminal of the first depletion mode MOSFET is coupled to the first head terminal, and the second transistor terminal of the first depletion mode MOSFET is coupled to the second head terminal. The gate terminal is biased to turn on the first depletion mode MOSFET while the disk drive is powered down, thereby shorting the first and second head terminals to protect the head from ESD.

The present invention may also be regarded as a method of protecting a head in a disk drive from electrostatic discharge (ESD). The head comprising a first head terminal and a second head terminal. A first transistor terminal of a first depletion mode metal oxide semiconductor field effect transistor (MOSFET) is coupled to the first head terminal. A second transistor terminal of the first depletion mode MOSFET is coupled to the second head terminal. A gate terminal is biased to turn on the first depletion mode MOSFET while the disk drive is powered down, thereby shorting the first and second head terminals to protect the head from ESD.

BRIEF DESCRIPTION OF THE DRAWINGS

FIGS. 7A–7B show an isometric and plan view of diffusion layers according to an embodiment of the present invention for fabricating the ESD protection circuit of FIG. 3.

DESCRIPTION OF THE PREFERRED EMBODIMENTS

Figure 2:
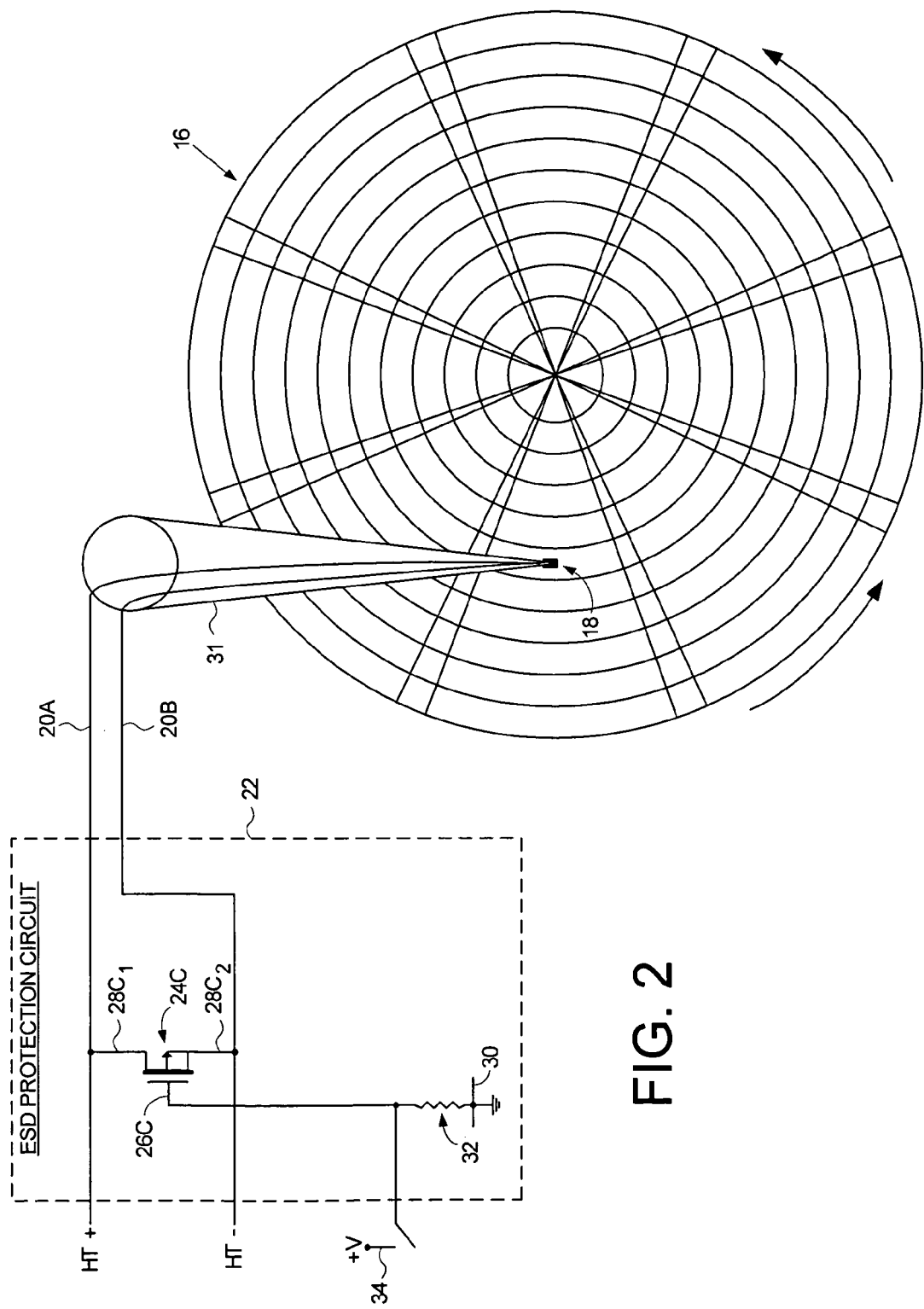
FIG. 2 shows a disk drive according to an embodiment of the present invention comprising a depletion mode MOSFET for shorting the head terminals while the disk drive is powered down, thereby protecting the head from ESD.

FIG. 2 shows a disk drive according to an embodiment of the present invention comprising a disk 16 and a head 18 actuated over the disk 16, wherein the head 18 comprising a first head terminal 20A and a second head terminal 20B. The disk drive further comprises an electrostatic discharge (ESD) protection circuit 22 employing a first depletion mode MOSFET 24C comprising a gate terminal 26C and a first and second transistor terminals $28C_1$ and $28C_2$. The first transistor terminal $28C_1$ of the first depletion mode MOSFET 24C is coupled to the first head terminal 20A, and the second transistor terminal $28C_2$ of the first depletion mode MOSFET 24C is coupled to the second head terminal 20B. The gate terminal 26C is biased to turn on the depletion mode MOSFET 24C while the disk drive is powered down, thereby shorting the first and second head terminals 20A and 20B to protect the head 18 from ESD.

Any suitable head 18 may be employed in the embodiments of the present invention. In one embodiment, the head 18 comprises a magnetoresistive (MR) read element.

The head 18 in the embodiment of FIG. 2 is attached to an actuator arm 31 (e.g., through a gimbal and slider not shown). The actuator arm 31 is rotated about a pivot by a voice coil motor (not shown) to actuate the head 18 radially over the disk 16 in order to access a target track on the surface of the disk 16. The head 18 generates a read signal which is conducted over the head terminals 20A and 20B along the length of the actuator arm 31, through a flex circuit (not shown), and into a preamp circuit (see FIG. 4). The disk drive may access multiple disk surfaces through a plurality of respective heads; however, in one embodiment only one head is active at a time (the head corresponding to the disk surface being read). The head terminals 20A and 20B are connected to the input of the preamp circuit which maintains the head terminals 20A and 20B at the proper voltage level, thereby providing ESD protection while the head 18 is active.

In one embodiment, the gate terminal 26C is biased to turn off the depletion mode MOSFET 24C while the disk drive is powered on. In this embodiment the head terminals 20A and 20B are not shorted when the head 18 is not actively reading the respective disk surface through the preamp circuit. In an alternative embodiment, the gate terminal 26C is biased to turn off the depletion mode MOSFET 24C only while the head 18 is activated for a read operation. While the head 18 is inactive, the gate 26C is biased to turn on the depletion mode MOSFET 24C to short the head terminals 20A and 20B and provide ESD protection while the head 18 is not being used.

The gate terminal 26C may be biased in any suitable manner in order to turn on the first depletion mode MOSFET 24C while the disk drive is powered down. A depletion mode MOSFET turns on when the gate terminal voltage with respect to the source terminal is substantially zero, and turns off when the gate terminal voltage with respect to the source terminal is substantially not zero (positive or negative depending on whether the MOSFET is a p-channel or n-channel). In the embodiment of FIG. 2, a resistor 32 pulls the gate terminal 26C toward ground 30 in order to turn on the first depletion mode MOSFET 24C while the disk drive is powered down. Any suitable ground may be used in the embodiments of the present invention, including the actuator arm, the flex circuit, or ground in the preamp circuit. The resistor 32 may also be implemented with any suitable device which pulls the gate terminal 26C toward ground 30.

The first depletion mode MOSFET 24C in the embodiment of FIG. 2 is a p-channel MOSFET. A positive voltage 34 is therefore applied to the gate terminal 26C to turn off the first depletion mode MOSFET 24C (e.g., when the disk drive is powered on or when the head 18 is activated). In an alternative embodiment, an n-channel depletion mode MOSFET is employed, and a negative voltage is applied to the gate terminal to turn off the first depletion mode MOSFET.

Figure 1:
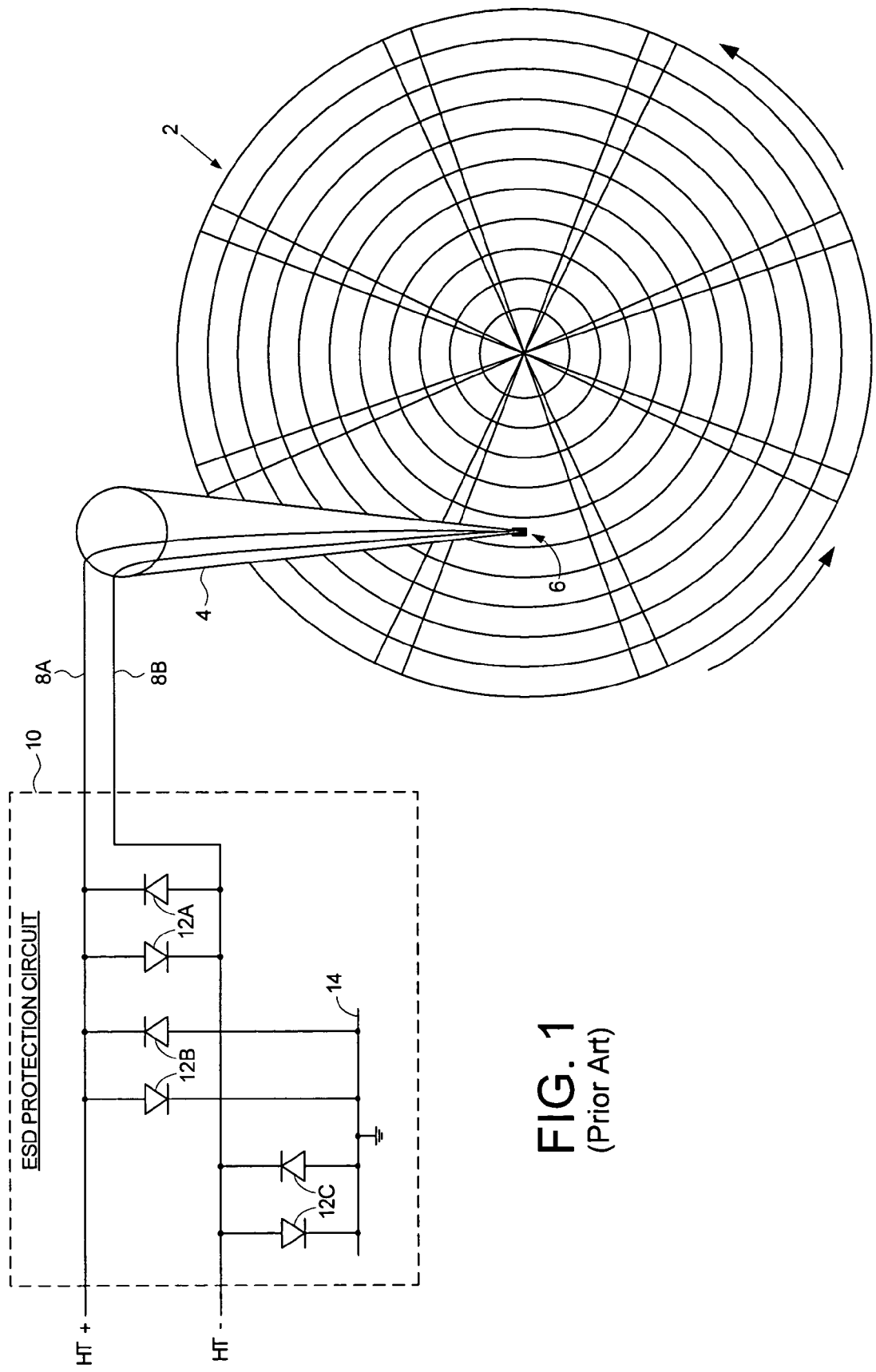
FIG. 1 shows a prior art disk drive comprising six diodes for limiting the voltage across the head terminals to protect a head against ESD.

Because the first depletion mode MOSFET 24C turns on with essentially no voltage applied to the gate terminal 26C, it provides much better low voltage ESD protection as compared to the diodes 12A–12C employed in the prior art disk drive of FIG. 1 which require a turn on voltage of 0.7 v. In addition, employing a single depletion mode MOSFET 24C rather than six diodes 12A–12C reduces the channel capacitance which enables faster data rates.

Figure 3:
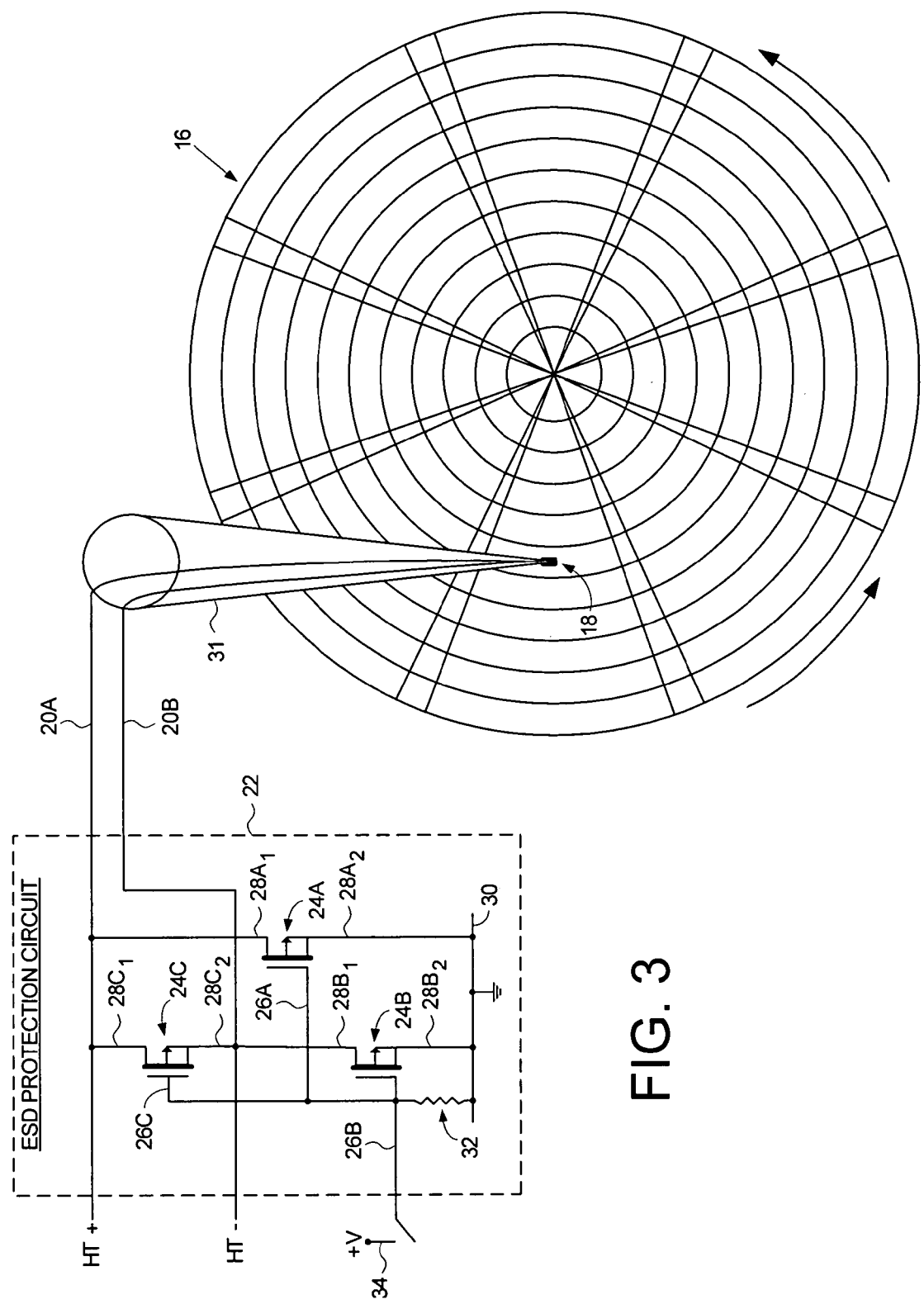
FIG. 3 shows a disk drive according to an embodiment of the present invention comprising a second and third depletion mode MOSFETs for grounding the head terminals together with the first depletion mode MOSFET for shorting the head terminals while the disk drive is powered down, thereby protecting the head from ESD.

FIG. 3 shows a disk drive according to an embodiment of the present invention comprising a second and third depletion mode MOSFETs 24A and 24B for grounding the head terminals 20A and 20B together with the first depletion mode MOSFET 24C for shorting the head terminals 20A and 20B while the disk drive is powered down, thereby protecting the head 18 from ESD.

Depletion mode MOSFETs are typically fabricated using an n-channel metal oxide semiconductor (NMOS) process to minimize the variance between devices so that the operating characteristics are predictable. However, the integrated circuits in a disk drive are typically fabricated using a process other than NMOS to reduce cost and power consumption. For example, the integrated circuits in a disk drive may be fabricated using a complimentary metal oxide semiconductor (CMOS) process, a bipolar/complimentary metal oxide semiconductor (BiCMOS) process, a silicon germanium (SiGe) process, or a gallium arsenide (GaAs) process. The depletion mode MOSFET employed in the embodiments of the present invention may be fabricated using any suitable process employed in the integrated circuits of a disk drive. The variance in fabricating a depletion mode MOSFET in a process other than NMOS does not affect the operating characteristics of the ESD protection circuit 22 since the gates of the depletion mode MOSFETs are biased so as to substantially turn the transistors on or off.

Figure 4:
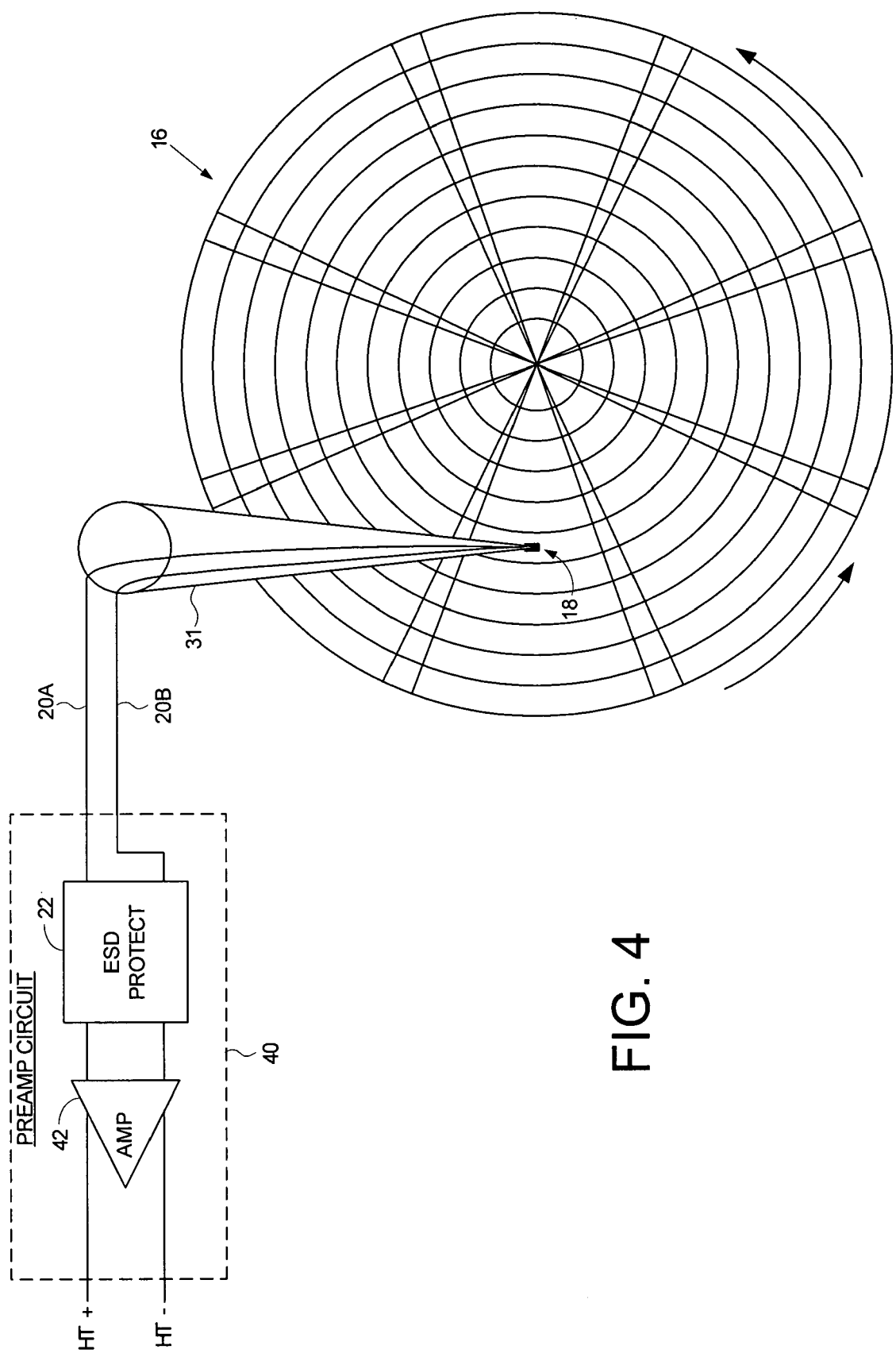
FIG. 4 shows a disk drive according to an embodiment of the present invention wherein the ESD protection circuit is integrated into a preamp circuit.
Figure 5:
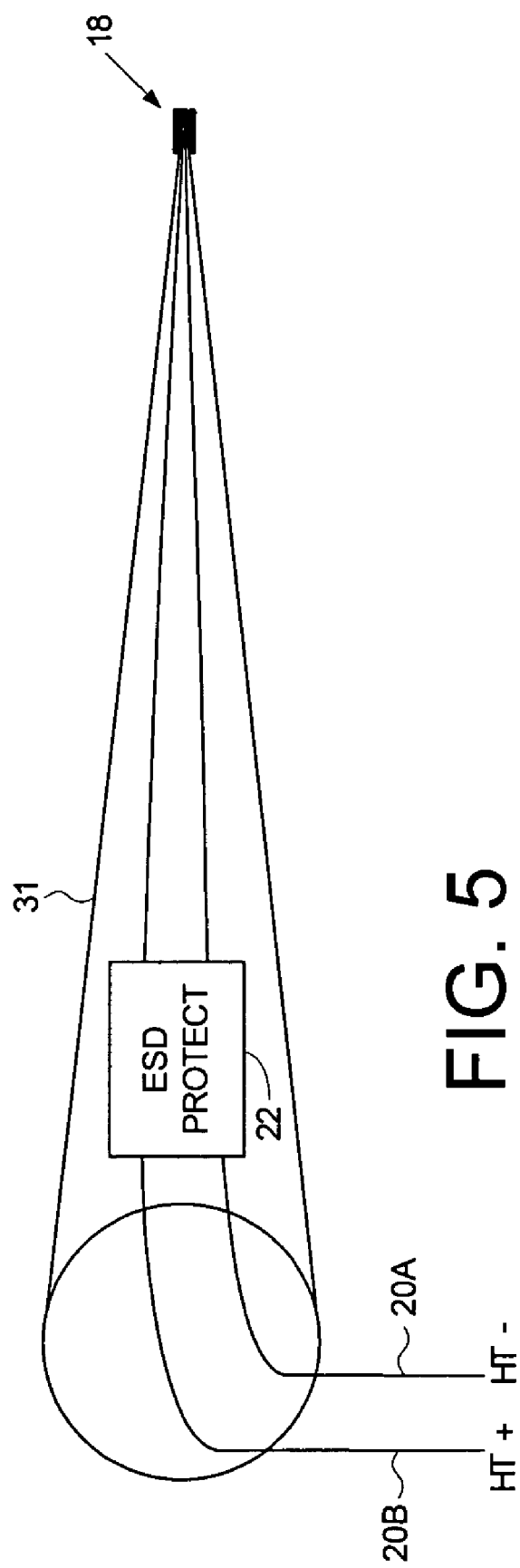
FIG. 5 shows an embodiment of the present invention wherein the ESD protection circuit comprises an integrated circuit coupled to the actuator arm.
Figure 6A:
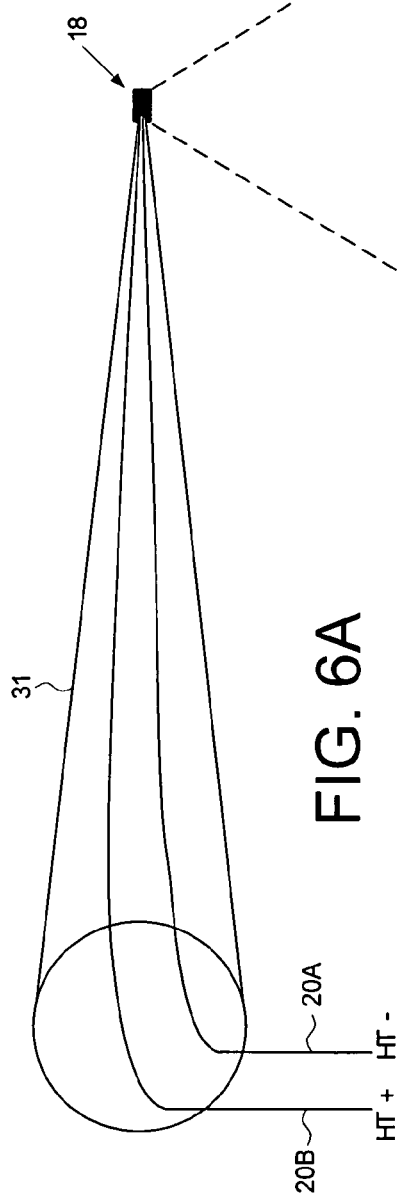
FIGS. 6A–6B show an embodiment of the present invention wherein the head comprises a silicon integrated circuit and the ESD protection circuit is integrated into the silicon integrated circuit.
Figure 6B:
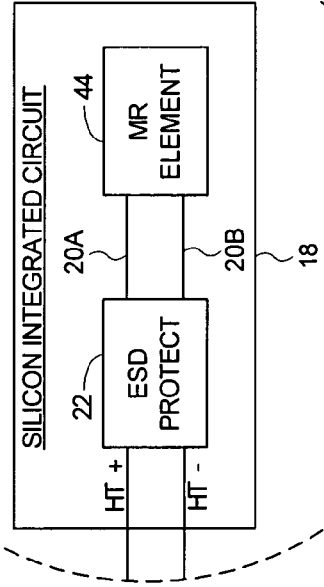

FIG. 4 shows an embodiment of the present invention wherein the ESD protection circuit 22 is integrated into a preamp circuit 40. The preamp circuit 40 comprises an amplifier 42 for amplifying the read signal generated by the head 18. The preamp circuit 40 is typically mounted on a bracket connected to the flex circuit. This embodiment may not provide adequate ESD protection due to the length of the electrical leads between the head 18 and the ESD protection circuit 22. In an alternative embodiment shown in FIG. 5, the ESD protection circuit 22 comprises an integrated circuit coupled to the actuator arm 31 preferably located near the head 18 to reduce the length of the electrical leads to the ESD protection circuit 22. In yet another embodiment shown in FIGS. 6A and 6B, the head 18 comprises a silicon integrated circuit and the ESD protection circuit 22 is integrated into the silicon integrated circuit. FIG. 6B shows a magnified view of the head 18 comprising an MR read element 44 and an ESD protection circuit 22 fabricated into a single integrated circuit.

The depletion mode MOSFET in the ESD protection circuit 22 may be fabricated in any suitable configuration, including configurations with common transistor terminals. FIG. 7A is an isometric view of a diffusion layer diagram for implementing the ESD protection circuit 22 of FIG. 3 according to an embodiment of the present invention. In this embodiment, the second transistor terminal 28A$_2$ of the second depletion mode MOSFET 24A shares a common source terminal with the second transistor terminal 28B$_2$ of the third depletion mode MOSFET 24B. The first transistor terminal 28A$_1$ of the second depletion mode MOSFET 24A shares a common drain terminal with the first transistor terminal 28C$_1$ of the first depletion mode MOSFET 24C. The first transistor terminal 28B$_1$ of the third depletion mode MOSFET 24B shares a common drain/source terminal with the second transistor terminal 28C$_2$ of the first depletion mode MOSFET 24C. FIG. 7B shows a back plan view of the diffusion layer diagram of FIG. 7A, including the first and second head terminals 20A and 20B, the resistor 32, and the positive voltage 34 applied to the gate terminals 26A, 26B and 26C to turn off the first, second and third depletion mode MOSFETs 24C, 24A and 24B.

The invention claimed is:

1. A disk drive comprising:
   (a) a disk;
   (b) a head actuated over the disk, the head comprising a first head terminal and a second head terminal; and
   (c) an electrostatic discharge (ESD) protection circuit comprising a first depletion mode metal oxide semiconductor field effect transistor (MOSFET) comprising a gate terminal and a first and second transistor terminals, wherein:
   the first transistor terminal of the first depletion mode MOSFET is coupled to the first head terminal;
   the second transistor terminal of the first depletion mode MOSFET is coupled to the second head terminal; and
   the gate terminal is coupled to ground through a resistive element to turn on the first depletion mode MOSFET while the disk drive is powered down, thereby shorting the first and second head terminals to protect the head from ESD.

2. The disk drive as recited in claim 1, wherein the head comprises a magnetoresistive (MR) read element.

3. The disk drive as recited in claim 1, wherein the gate terminal is biased to turn off the first depletion mode MOSFET while the disk drive is powered on.

4. The disk drive as recited in claim 1, wherein the gate terminal is biased to turn off the first depletion mode MOSFET while the head is activated for a read operation.

5. The disk drive as recited in claim 1, wherein the ESD protection circuit comprises a complimentary metal oxide semiconductor (CMOS) process.

6. The disk drive as recited in claim 5, wherein the ESD protection circuit comprises a bipolar/complimentary metal oxide semiconductor (BiCMOS) process.

7. The disk drive as recited in claim 1, wherein the ESD protection circuit comprises a silicon germanium (SiGe) process.

8. The disk drive as recited in claim 1, wherein the ESD protection circuit comprises a gallium arsenide (GaAs) process.

9. The disk drive as recited in claim 1, further comprising a preamp circuit for amplifying a read signal generated by the head, wherein the ESD protection circuit is integrated into the preamp circuit.

10. The disk drive as recited in claim 1, further comprising an actuator arm for actuating the head over the disk, wherein the ESD protection circuit comprises an integrated circuit coupled to the actuator arm.

11. The disk drive as recited in claim 1, wherein:
   (a) the head comprises a silicon integrated circuit; and
   (b) the ESD protection circuit is integrated into the silicon integrated circuit.

12. An electrostatic discharge (ESD) protection circuit for protecting a head actuated over a disk in a disk drive, the head comprising a first head terminal and a second head terminal, the ESD protection circuit comprising a first depletion mode metal oxide semiconductor field effect transistor (MOSFET) comprising a gate terminal and a first and second transistor terminals, wherein:
   (a) the first transistor terminal of the first depletion mode MOSFET is coupled to the first head terminal;
   (b) the second transistor terminal of the first depletion mode MOSFET is coupled to the second head terminal; and
   (c) the gate terminal is coupled to ground through a resistive element to turn on the first depletion mode MOSFET while the disk drive is powered down, thereby shorting the first and second head terminals to protect the head from ESD.

13. The ESD protection circuit as recited in claim 12, wherein the head comprises a magnetoresistive (MR) read element.

14. The ESD protection circuit as recited in claim 12, wherein the gate terminal is biased to turn off the first depletion mode MOSFET while the disk drive is powered on.

15. The ESD protection circuit as recited in claim 12, wherein the gate terminal is biased to turn off the first depletion mode MOSFET while the head is activated for a read operation.

16. The ESD protection circuit as recited in claim 12, wherein the ESD protection circuit comprises a complimentary metal oxide semiconductor (CMOS) process.

17. The ESD protection circuit as recited in claim 16, wherein the ESD protection circuit comprises a bipolar/complimentary metal oxide semiconductor (BiCMOS) process.

18. The ESD protection circuit as recited in claim 12, wherein the ESD protection circuit comprises a silicon germanium (SiGe) process.

19. The ESD protection circuit as recited in claim 12, wherein the ESD protection circuit comprises a gallium arsenide (GaAs) process.

20. The ESD protection circuit as recited in claim 12, wherein the disk drive further comprising a preamp circuit for amplifying a read signal generated by the head, wherein the ESD protection circuit is integrated into the preamp circuit.

21. The ESD protection circuit as recited in claim 12, wherein the disk drive further comprising an actuator arm for actuating the head over the disk, wherein the ESD protection circuit comprises an integrated circuit coupled to the actuator arm.

22. The ESD protection circuit as recited in claim 12, wherein:
   (a) the head comprises a silicon integrated circuit; and
   (b) the ESD protection circuit is integrated into the silicon integrated circuit.

23. A head for use in a disk drive comprising a disk, the head comprising a first head terminal and a second head terminal, the head comprising a silicon integrated circuit including an electrostatic discharge (ESD) protection circuit comprising a first depletion mode metal oxide semiconductor field effect transistor (MOSFET) comprising a gate terminal and a first and second transistor terminals, wherein:
   (a) the first transistor terminal of the first depletion mode MOSFET is coupled to the first head terminal;
   (b) the second transistor terminal of the first depletion mode MOSFET is coupled to the second head terminal; and
   (c) the gate terminal is coupled to ground through a resistive element to turn on the first depletion mode MOSFET while the disk drive is powered down, thereby shorting the first and second head terminals to protect the head from ESD.

24. The head as recited in claim 23, wherein the head comprises a magnetoresistive (MR) read element.

25. The head as recited in claim 23, wherein the gate terminal is biased to turn off the first depletion mode MOSFET while the disk drive is powered on.

26. The head as recited in claim 23, wherein the gate terminal is biased to turn off the first depletion mode MOSFET while the head is activated for a read operation.

27. The head as recited in claim 23, wherein the ESD protection circuit comprises a complimentary metal oxide semiconductor (CMOS) process.

28. The head as recited in claim 23, wherein the ESD protection circuit comprises a bipolar/complimentary metal oxide semiconductor (BiCMOS) process.

29. The head as recited in claim 23, wherein the ESD protection circuit comprises a silicon germanium (SiGe) process.

30. The head as recited in claim 23, wherein the ESD protection circuit comprises a gallium arsenide (GaAs) process.

31. A method of protecting a head in a disk drive from electrostatic discharge (ESD), the head comprising a first head terminal and a second head terminal, the method comprising the steps of:
   (a) coupling a first transistor terminal of a first depletion mode metal oxide semiconductor field effect transistor (MOSFET) to the first head terminal;
   (b) coupling a second transistor terminal of the first depletion mode MOSFET to the second head terminal; and
   (c) coupling a gate terminal of the first depletion mode MOSFET to ground through a resistive element to turn on the first depletion mode MOSFET while the disk drive is powered down, thereby shorting the first and second head terminals to protect the head from ESD.

32. The method as recited in claim 31, wherein the head comprises a magnetoresistive (MR) read element.

33. The method as recited in claim 31, further comprising the step of biasing the gate terminal to turn off the first depletion mode MOSFET while the disk drive is powered on.

34. The method as recited in claim 31, further comprising the step of biasing the gate terminal to turn off the first depletion mode MOSFET while the head is activated for a read operation.

35. The method as recited in claim 31, further comprising the step of fabricating the first depletion mode MOSFET using a complimentary metal oxide semiconductor (CMOS) process.

36. The method as recited in claim 35, further comprising the step of fabricating the first depletion mode MOSFET using a bipolar/complimentary metal oxide semiconductor (BiCMOS) process.

37. The method as recited in claim 31, further comprising the step of fabricating the first depletion mode MOSFET using a silicon germanium (SiGe) process.

38. The method as recited in claim 31, further comprising the step of fabricating the first depletion mode MOSFET using a gallium arsenide (GaAs) process.

* * * * *